United States Patent

[11] 3,611,196

[72] Inventors Wolfgang Tolksdorf
Tornesch;
Peter Holst, Pinneberg, both of Germany
[21] Appl. No. 13,104
[22] Filed Feb. 20, 1970
[45] Patented Oct. 5, 1971
[73] Assignee U.S. Philips Corporation
New York, N.Y.
[32] Priority Feb. 27, 1969
[33] Germany
[31] P 19 09 936.6

[54] INTEGRATED MICROWAVE SYSTEM HAVING A HYBRID STRUCTURE WITH A NONMAGNETIC DIELECTRIC CERAMIC SUBSTRATE

9 Claims, 3 Drawing Figs.

[52] U.S. Cl. .......... 333/1.1, 333/24.2, 333/84 M
[51] Int. Cl. .......... H01p 1/32
[50] Field of Search .......... 333/1.1, 24.1–24.3, 84 M

[56] References Cited
OTHER REFERENCES
R. R. Jones et al., NonFerrite Microstrip Devices, Microwaves, Jan. 1969, pg. 33 relied on 333- 1.1

*Primary Examiner*—Herman Karl Saalbach
*Assistant Examiner*—Paul L. Gensler
*Attorney*—Frank R. Trifari

ABSTRACT: An integrated microwave system having a hybrid structure using a nonmagnetic dielectric ceramic substrate consisting of a sintered ferrite having a lower Curie point than the lowest operating temperature of the system. The system includes two or more interconnected elements integrally united with the substrate. Each of these elements consists essentially of a soft magnetic ferrite which is sintered to the substrate.

INVENTORS
WOLFGANG TOLKSDORF
PETER HOLST
BY
AGENT

INTEGRATED MICROWAVE SYSTEM HAVING A HYBRID STRUCTURE WITH A NONMAGNETIC DIELECTRIC CERAMIC SUBSTRATE

The invention relates to a substrate consisting of a nonmagnetic dielectric, ceramic material and destined for an integrated microwave system having a hybrid structure, in which substrate regions of a soft-magnetic, sintered ferrite are present. An integrated microwave system is to be understood to mean a system in which several structural components in the form of integrated circuits are provided on a substrate. The thickness of such substrates is of the order of magnitude of approximately 0.5 mm. The individual components are interconnected by vapor-deposited metallic conductors. Such microwave systems comprise, for example, circulators, phase shifters, directional couplers, ferrite switches and damping members and are used in X-band-Doppler radar and CW-radar plants, respectively. The soft-magnetic ferrite regions can be premagnetized in a direction at right angles to the surface of the substrate by means of permanent magnets arranged below the substrate.

In known systems of this type (see, for example, "-Proceedings of the IEEE," 1966, pp. 2,022–2,024, and in 1968, pp. 352–353) in which, in connection with the required small dimensions, a dielectric constant exceeding 9 is necessary, sintered aluminum oxide, $Al_2O_3$, is used as a nonmagnetic ceramic material. The tin aluminum oxide plate comprises one or several perforations in which plates having the correct shape and dimensions and consisting of sintered soft-magnetic ferrite have been glued. During the subsequent vapor deposition of the metallic conductors which connect the various components, however, the narrow gap present between the aluminum oxide substrate and the glued ferrite plates presents difficulties. Actually, the conductor material penetrates said gap during the vapor deposition as a result of which short circuits and conduction interruptions can be caused at said area. Other drawbacks associated with the use of aluminum oxide as a material for the nonmagnetic substrate are the high sintering temperature (approximately 1,650° C.) and the poor mechanical processability of said material as a result of its great hardness.

The problem underlying the invention was to remove the said drawbacks and to find a substrate suitable for an above-mentioned microwave system which substrate can be manufactured simply and cheaply.

According to the invention this problem is solved in that the nonmagnetic material of the substrate consists of a sintered ferrite having a Curie-point which lies below the lowest operating temperature of the microwave system and that the two ferrite materials are connected together by sintering. So in this case both the magnetic and the nonmagnetic regions of the substrate consist of ferrite, namely the first-mentioned consists of a ferrite having an Curie-temperature which is considerably higher, and the last-mentioned consists of a ferrite having a Curie-temperature which is considerably lower than the operating temperature of the microwave system. Due to the simultaneous thermal treatment of the two ferrite materials, these are sintered together and consequently interconnected directly without an intermediate gap. When the metallic conductors are provided, conductor material can no longer penetrate into the substrate. Sintered ferrites are not so hard as aluminum oxide so that bodies consisting of said ferrites can be processed in a comparatively easier manner, particularly by grinding off. Moreover, both magnetic and nonmagnetic ceramic materials have dielectric constants of approximately 10–15 and equal dielectric losses, while those of aluminum oxide and those of ferrite mutually differ considerably.

It is to be noted that substrates for microwave systems are also known which consist entirely of a magnetic ferrite (see "Electronics,"1968, pp. 104–118). However, in this case large magnetic losses occur. In addition, the coupling between the various magnetic circuits is too strong. The propagation of the waves is considerably influenced by external magnetic fields and by the temperature. These drawbacks are avoided if, according to the invention, the substrate around the various magnetic regions consists of a nonmagnetic ferrite.

The ferrite materials used in the system according to the invention must show as much as possible the same structure and the same sintering properties, for example, sintering temperature, shrinkage and the like. As a result of this the two ferrite materials can be sintered together to form a compact body.

Ferrites having cubic spinel structures may be chosen for the two substrate materials. In this case the two substrate materials preferably consist of manganese-magnesium ferrite having a rectangular hysteresis loop, since these are most suitable for microwave applications. Starting from the magnetic manganese-magnesium ferrite, a part of the iron ions are preferably replaced by aluminum ions so as to obtain the associated nonmagnetic ferrite.

The two substrate materials may also consist of ferrites having a garnet structure and particularly of yttrium-iron garnets. In order to obtain the associated nonmagnetic garnet, a part of the iron ions in the magnetic garnet are preferably replaced by aluminum- and/or silicon- + calcium ions.

The invention furthermore relates to a method of manufacturing the substrates in question.

Such a method which is preferably used according to the invention is characterized in that the two prefired ferrite materials are mixed in a finely divided condition with a plastic binder and processed to thin films after which one or more pieces corresponding in shape and dimensions with the desired magnetic regions of the substrate are removed from the film consisting of the nonmagnetic ferrite and at that area fitting film parts of the magnetic ferrite are introduced after which finally the assembly is again compressed and sintered.

According to another method of manufacturing a substrate according to the invention, the two prefired ferrite materials are pulverized and granulated, transferred collectively according to the desirable region distribution of the substrate into a matrix, and molded therein, after which the resulting compressed body is sintered.

The invention will now be described in greater detail with reference to the accompanying drawing, in which.

Figures 1, 2, 3:
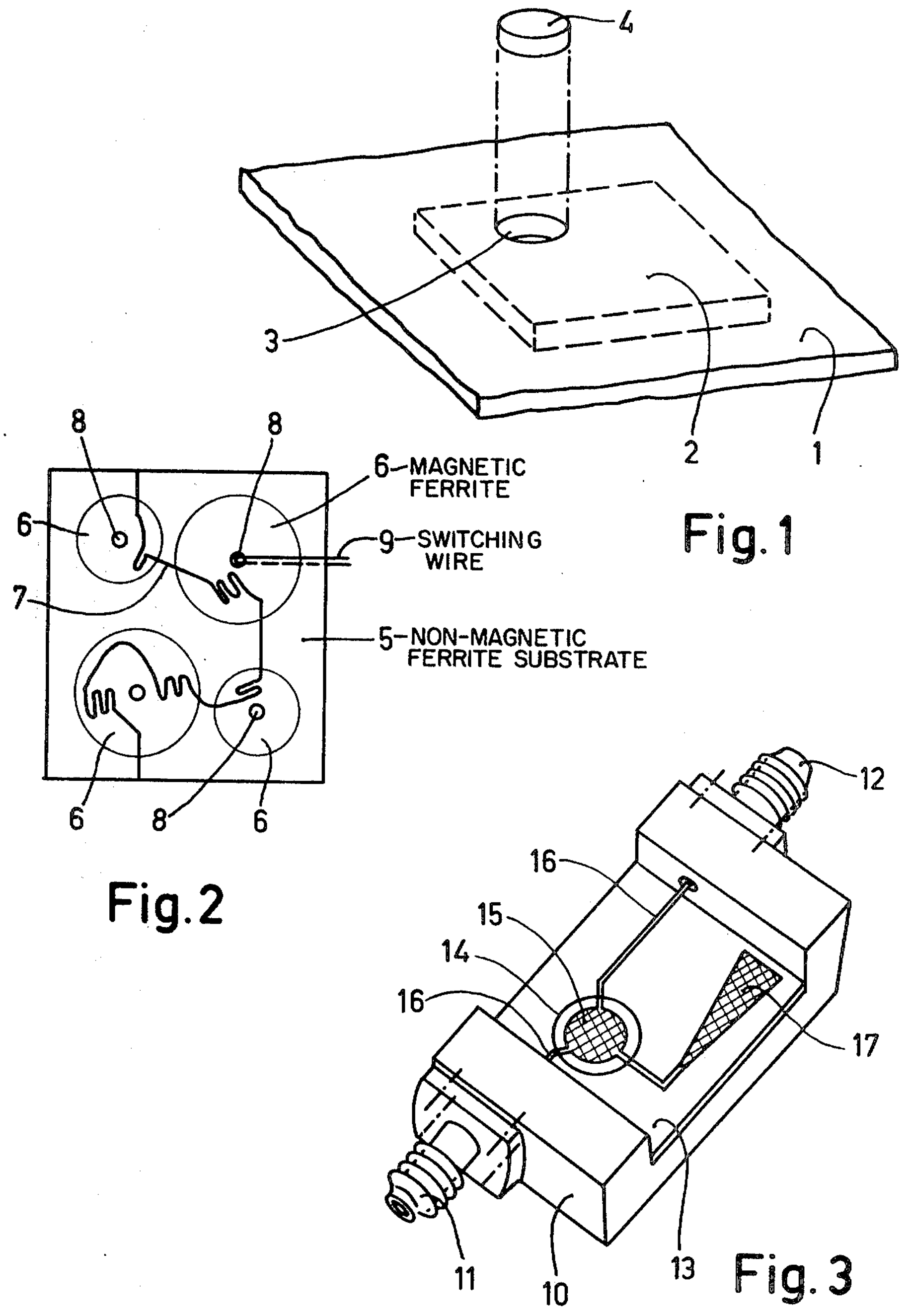
FIG. 1 is a perspective view of a substrate for a microwave system.
FIG. 2 is a plan view of a substrate of a 4-bit-microwave phase shifter manufactured according to the invention.
FIG. 3 is a perspective view of a microwave isolator having a substrate according to the invention.

Ferrites of the following composition were prepared in known manner from the relative metal oxides or metal compounds which upon heating are converted into said oxides, by mixing, grinding and prefiring at temperatures between approximately 1,100° C. and 1,300° C.:

a. magnetic ferrite having spinel structure ${}^{Mg}1.19^{Mn}0.08^{Fe}1.71^{Al}0.21^{O}(4zF)$ dielectric constant $\epsilon=13.0$ at 9.3 GHz. $\tan\delta_\epsilon \leqq 5.10^{-4}$ at 9.3 GHz. Curie-temperature, $T_c=+185°$ C. Saturation magnetization, $4\pi M_s=1{,}900$ gauss b. nonmagnetic ferrite having spinel structure ${}^{Mg}0.9^{Zn}0.1^{Mn}0.1^{Febh1.2Al}0.8^{O}(4+\Delta)$ $\epsilon=11.3$ at 9.3 GHz.; $\tan\delta_\epsilon=5.10^{-4}$; $T_c=-18.5°$ C.

c. magnetic ferrite having garnet crystal structure ${}^{Y}3^{Fe}4.6^{Al}0.4^{O}$ $\epsilon=15$ at 9.3 GHz.; $\tan\delta_\epsilon=5.10^{-4}$; $T_c=230°$ C.; $4\pi M_s=1{,}200$ gauss d. nonmagnetic ferrite having garnet crystal structure ${}^{Y}2.9^{Ca}0.1^{Fe}3^{SiAl}1.9^{O}12$ $\epsilon=14$ at 9.3 GHz.; $\tan\delta_\epsilon=5.10^{-4}$; $T_c=-17°$ C.

1. The lamination method

A 20 percent by weight solution of a plastic synthetic resin, for example, an alkene polymer on the basis of ethene vinyl acetate, in trichloroethene, and 2.5 percent by weight of dioctylphthalate as a softener is mixed in a mixer with 75 percent by weight of one of the above-described prefired and dry ground magnetic ferrite powders (grain size approximately 1 micron), after which the solvent is slowly evaporated *in vacuo*. The mass which is now kneadable is extruded and the strand thus obtained is laminated to a foil of approximately 1 mm. thick. In the same manner a foil of the nonmagnetic ferrite material of the same structure is manufactured. From the foil 1 (see FIG. 1) of the nonmagnetic ferrite one or more pieces correspond in shape and dimensions to the desirable magnetic regions 3 of the subsequent substrate 2 for microwave systems are removed (for example, by punching) and replaced by pieces 4 of corresponding shape obtained from foils of the magnetic ferrite. The nonmagnetic substrate 2 is then punched out of the foil and the substrate parts 2 and 4 are connected together by compressing or rolling. The assembly is then sintered at a temperature of approximately 1,450° C. for approximately 3 hours. The resulting ferrite plates can readily be ground and polished mechanically. They are subsequently provided with vapor-deposited conductors, resistance layers, active elements or the like.

2. The molding method

The presintered and dry ground magnetic and nonmagnetic ferrite powders (grain size approximately 1 $\mu$) of the same structure are always mixed with 5 percent by weight of an unsaturated polyester resin until a granulate is formed. The two magnetic and nonmagnetic ferrite granules, respectively, are then transferred collectively according to the desirable region distribution of the microwave system substrate to a matrix and molded therein collectively under a pressure which may amount to 4 tons/sq.cm. The resulting molding is then sintered at a temperature of approximately 1,450° C. for 2 hours. The sintered ferrite plates can also be readily machined mechanically and are subsequently further processed as well as the ferrite plates manufactured by means of the lamination method.

The substrate shown in FIG. 2 consists of a square plate 5 of a nonmagnetic ferrite having edges 30 mm. long and 0.6 mm. thick, in which four circular disks 6 of magnetic ferrite having a rectangular hysteresis loop have been inserted according to one of the above-described methods. A metallic conductor 7 is vapor-deposited on the substrate 5, 6 in such manner that four digital phase shifters arranged one behind the other are formed.

The magnetic regions 6 have circular apertures 8 through each of which a switching wire 9 is threaded by means of which the sign of the retentivity of the magnetic substrate regions 6 can be changed. Adjacent phase shifters are substantially not influenced since they are separated from each other by nonmagnetic ferrite 5. No holding current is required. The phase shifters are not reciprocal and can be used within a wide frequency band (of, for example, from 8 to 12 GHz.).

The manufactured substrate is provided on a metal base layer consisting, for example, of brass, which layer can be provided with connection terminals for the connection of supply lines for the metallic conductor 7.

The isolator shown in FIG. 3 comprises a metal grip 10 consisting, for example, of brass having connections 11 and 12 on which a substrate of a nonmagnetic ferrite 13 is provided in which a disk-shaped region 14 of magnetic ferrite has been inserted. A circular metallization 15 is vapor-deposited on the magnetic region 14 to which metallization vapor-deposited metal conductors 16 and a reflection-free energy absorber 17 also adjoin. The magnetic substrate region 14 forms an X-band-strip conduction circulator together with the disk-shaped metallization 15. The magnetic substrate region 14 is premagnetized by means of a permanent magnet (not shown) arranged in the grip 10 below the region 14 in a direction at right angles to the surface of the substrate.

What is claimed is:

1. An integrated microwave system having a hybrid structure comprising a nonmagnetic dielectric ceramic substrate consisting of a sintered ferrite having a Curie point lower than the lowest operating temperature of said system, said system comprising a plurality of interconnected circuit elements each comprised essentially of a soft magnetic sintered ferrite integrally joined with said substrate.

2. An integrated microwave system as claimed in claim 1 wherein the ferrite materials of the substrate and the system elements have a cubic spinel structure.

3. An integrated microwave system as claimed in claim 2, wherein the said ferrite materials consist of manganese-magnesium ferrites.

4. An integrated microwave system as claimed in claim 3, wherein the substrate ferrite is a manganese-magnesium-aluminum ferrite.

5. An integrated microwave system as claimed in claim 1 wherein the ferrite materials of the substrate and the system elements have a garnet structure.

6. An integrated microwave system as claimed in claim 5, wherein the said ferrite materials consist of yttrium-iron garnet.

7. An integrated microwave system as claimed in claim 6, wherein the substrate ferrite is an yttrium-aluminum-iron garnet.

8. An integrated microwave system as claimed in claim 6 in which a portion of the iron in the yttrium-iron garnet has been replaced by silicon and calcium.

9. An integrated microwave system as claimed in claim 7 in which a portion of the iron in the yttrium-iron garnet has been replaced by silicon and calcium.